(12) United States Patent
Bandara et al.

(10) Patent No.: US 7,745,815 B2
(45) Date of Patent: Jun. 29, 2010

(54) POLARIZATION-SENSITIVE QUANTUM WELL INFRARED PHOTODETECTOR FOCAL PLANE ARRAY

(75) Inventors: Sumith V. Bandara, Valencia, CA (US); Sarath Gunapala, Stevenson Ranch, CA (US); John K. Liu, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 722 days.

(21) Appl. No.: 11/653,785

(22) Filed: Jan. 16, 2007

(65) Prior Publication Data

US 2007/0187604 A1    Aug. 16, 2007

Related U.S. Application Data

(60) Provisional application No. 60/760,535, filed on Jan. 16, 2006.

(51) Int. Cl.
*H01L 29/06* (2006.01)
*H01L 31/072* (2006.01)
*H01L 31/109* (2006.01)
*H01L 33/00* (2006.01)

(52) U.S. Cl. .............................. 257/14; 257/21; 257/98

(58) Field of Classification Search ............. 257/10–27, 257/88–103, E33.72
See application file for complete search history.

(56) References Cited

U.S. PATENT DOCUMENTS 6,423,980 B1 * 7/2002 Wilson et al. ................. 257/21
6,445,000 B1 * 9/2002 Masalkar et al. ............. 257/21
6,504,180 B1 * 1/2003 Heremans et al. ............ 257/98

OTHER PUBLICATIONS

Gunapala, Sarath, "1024×1024 Pixel Mid-Wavelength and Long-Wavelength Infrared QWIP Focal Place Arrays for Imaging Applications", *Semiconductor Science and Technology*, Mar. 23, 2005,473-480.
Gunapala, Sarath, "Megapixel QWIPs Deliver Muli-Color Performance", *Compound Semiconductor*, Oct. 2005, vol. 10, No. 9,3 pages.
Gunapala, Sarath, "QWIPs Multi-Spectral Mine Clearance and Medical", *III-Vs Review The Advanced Semiconductor Magazine*, Mar. 2005, vol. 18, No. 2, (Mar. 2005),44-48.

* cited by examiner

*Primary Examiner*—Cuong Q Nguyen

(57) ABSTRACT

A quantum well infrared photodetector (QWIP) focal plane array having structures, each structure having stacked layers of quantum wells and a reflective grating to provide polarization sensitivity. The reflective grating is etched to provide electrical contacts for individual pixels. The reflective gratings comprise grooves, where the grooves for a particular structure run in a particular direction to provide polarization sensitivity. Each structure may comprise groups of quantum well layers, each group sensitive to a particular frequency band. By shorting out unwanted quantum well layers, and by forming the reflective gratings to come into contact with the quantum well layers having a particular frequency band sensitivity, the pixels in the QWIP focal plane array may provide frequency and polarization information.

19 Claims, 4 Drawing Sheets

POLARIZATION-SENSITIVE QUANTUM WELL INFRARED PHOTODETECTOR FOCAL PLANE ARRAY

This application claims the benefit of U.S. Provisional Application No. 60/760,535, filed 16 Jan. 2006, and is incorporated herein by reference.

The invention claimed herein was made in the performance of work under a NASA contract, and is subject to the provisions of Public Law 96-517 (35 USC 202) in which the Contractor has elected to retain title.

FIELD

The present invention relates to infrared imagers, and more particularly, to quantum well infrared photodetector focal plane arrays.

BACKGROUND

A quantum well designed to detect infrared radiation (IR) is usually referred to as a quantum well infrared photodetector (QWIP). A candidate for a QWIP is the square quantum well of basic quantum mechanics. When a quantum well is sufficiently deep and narrow, its energy states are quantized (discrete). The potential depth and width of the well may be adjusted so that it holds only two energy states: a ground state near the well bottom, and a first excited state near the well top. A photon striking the well may excite an electron in the ground state to the first excited state, whereby an externally applied electric field sweeps the exited electron out to produce a photocurrent.

A quantum well may be comprised of a first semiconductor sandwiched between two layers of a second semiconductor, where the first and second semiconductors have an energy gap to form the energy well. Quantum wells may be stacked to increase efficiency. FIG. 1a illustrates this in pictorial form, where alternating epitaxial layers of doped GaAs and undoped $Al_{0.3}Ga_{0.7}As$ are grown on a semi-insulating GaAs substrate by molecular beam epitaxy (MBE). The GaAs epitaxial layers may be doped having an electron donar doping concentration of $n=5\times10^{17}$ $cm^{-3}$, for example. FIG. 1b illustrates the resulting wells and energy bands in pictorial form, illustrating a photon hv causing an electron to be exited from low energy state 102 to the conduction band, and illustrating electrons 104 in the conduction band contributing to a photocurrent when an electric field is applied.

Only photons having energies corresponding to the energy separation between the two energy states are absorbed, resulting in a photodetector having a relatively sharp absorption spectrum. Designing a quantum well to detect electromagnetic radiation of a particular wavelength becomes a matter of tailoring the potential depth and width of the quantum well to produce two states separated by the desired photon energy. However, QWIPs without light coupling structures do not absorb radiation normal to the surface because the radiation polarization must have an electric field component normal to the superlattice (growth direction) to be absorbed by the confined carriers (e.g., electrons).

FIG. 2 illustrates this in pictorial form, where a single quantum well (202) is illustrated. The vector $\vec{p}_z$ in FIG. 2 has a direction along the growth of the epitaxial layers making up quantum well 202, and denotes the direction of the z axis. As indicated in FIG. 2, the z axis is taken along the growth direction, and the y axis is taken in the plane of the illustration, so that the x axis points out of the illustration. Infrared radiation is indicated by IR in FIG. 2, having a polarization in the x-y plane so that the electric field vector has a zero component in the z direction. The dot product of the electric field vector and the growth direction is zero, and as a result no absorption takes place.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1A:
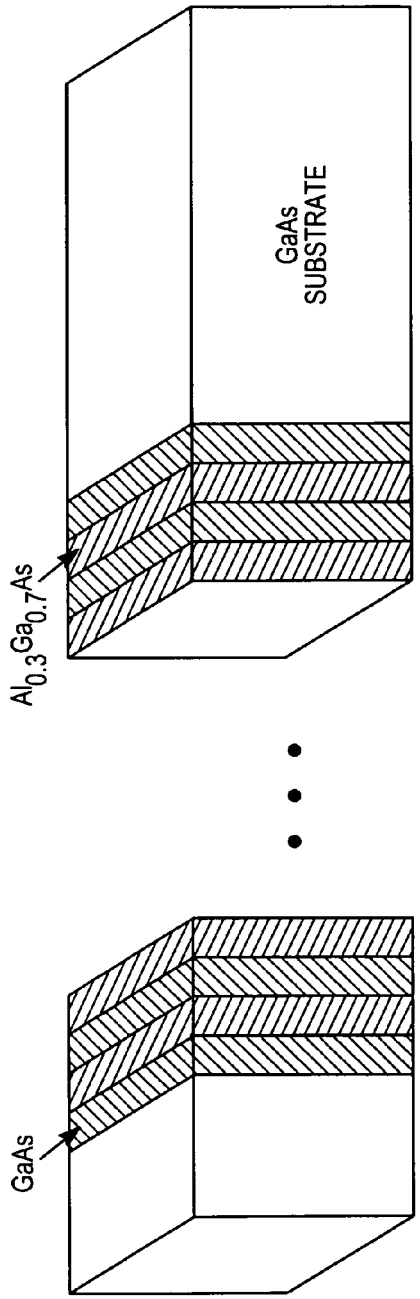
FIG. 1A illustrates a prior art quantum well.
Figure 1B:
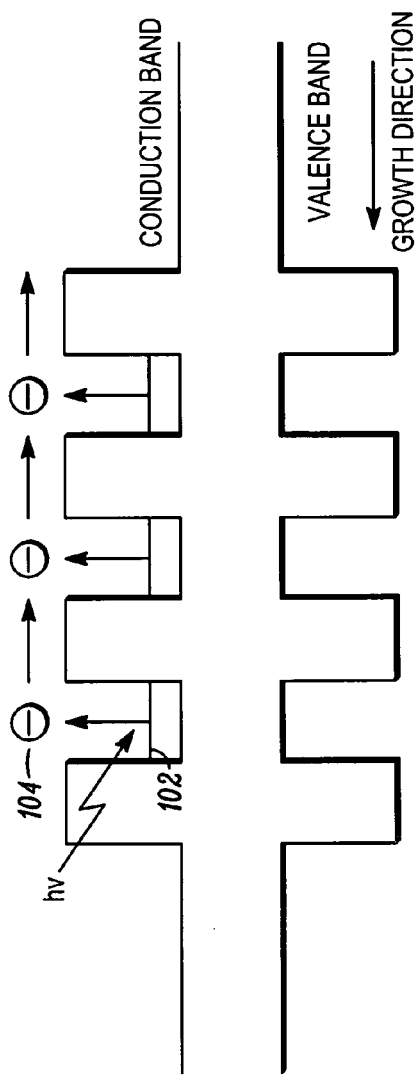
FIG. 1B illustrates the conduction and valence bands of a prior art quantum well.
Figure 2:
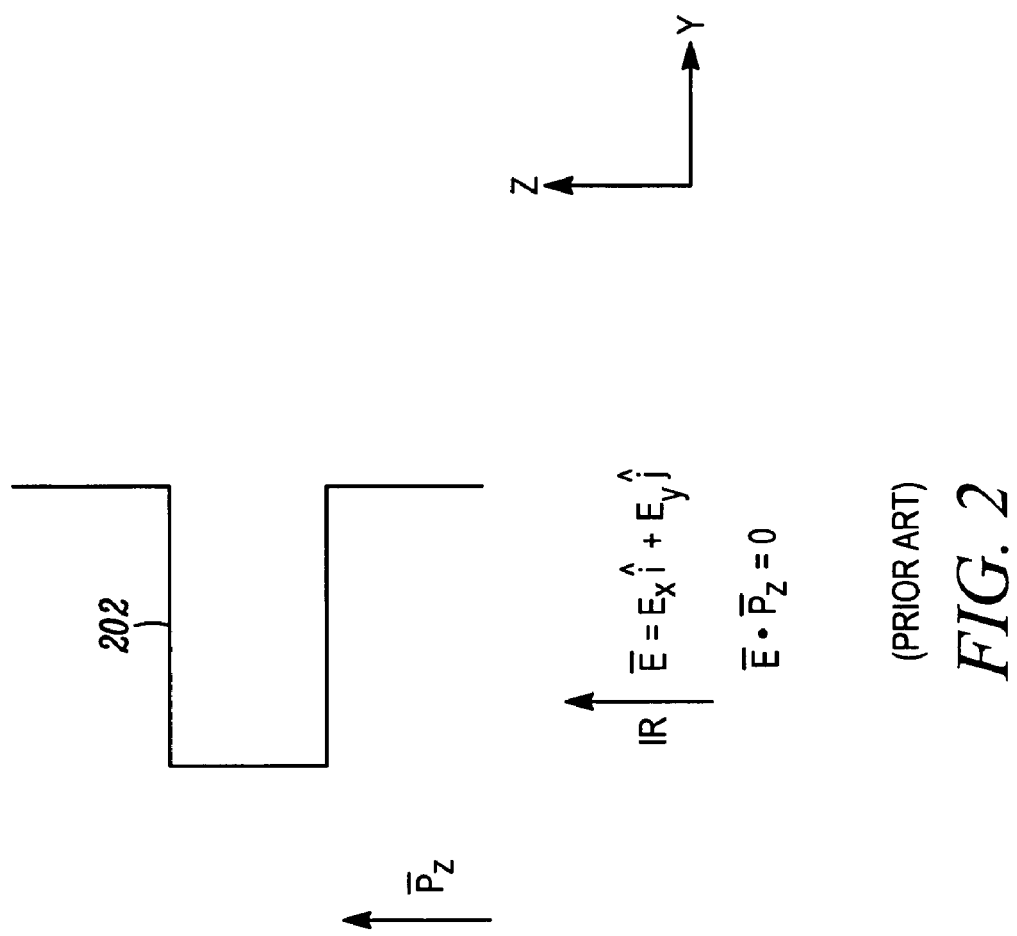
FIG. 2 illustrates incident infrared radiation having a polarization with zero component in the growth direction of a prior art quantum well.
Figure 3:
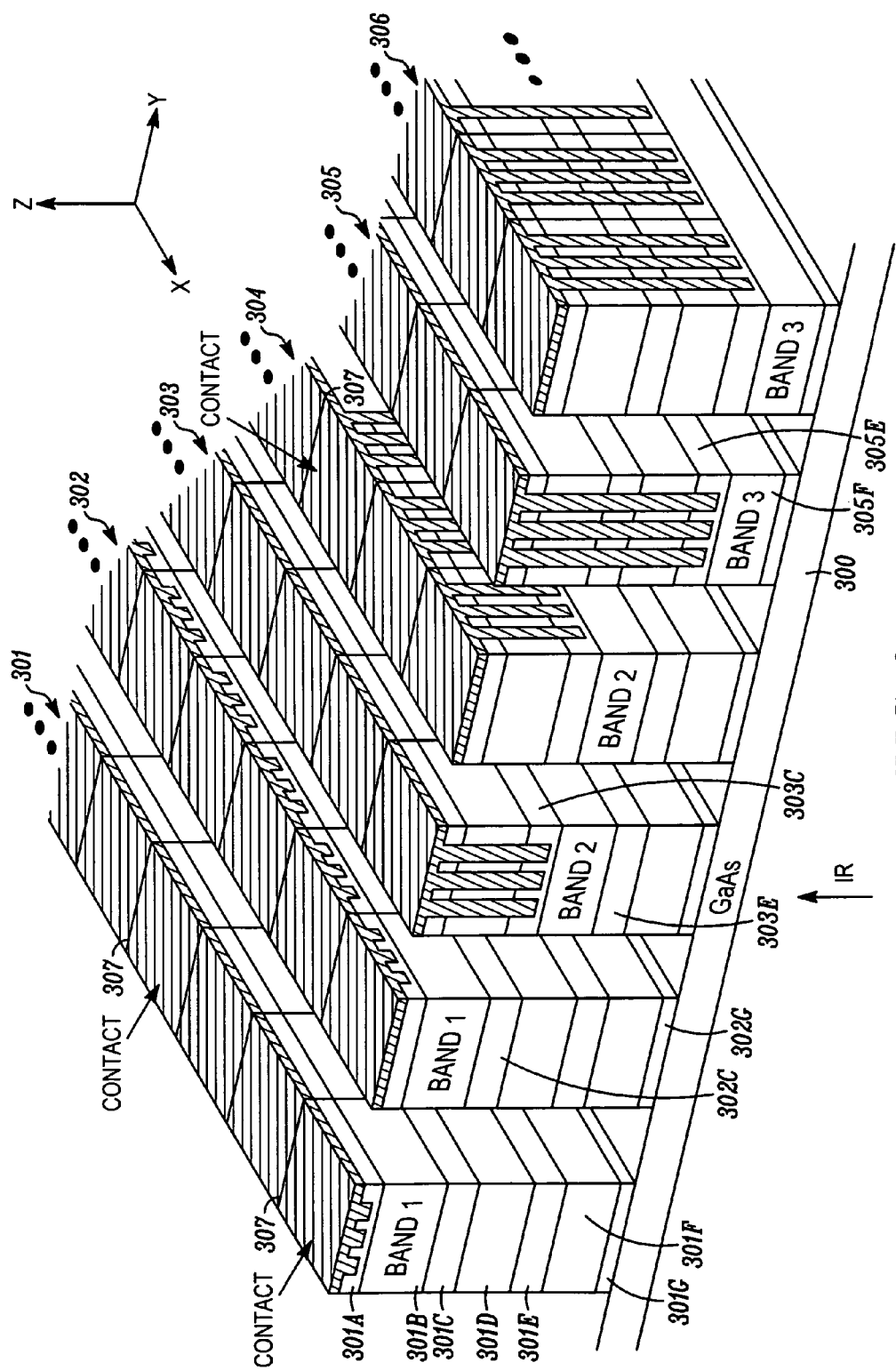
FIG. 3 illustrates a quantum well infrared photodetector focal plane array according to an embodiment of the present invention.

FIG. 3 illustrates a simplified perspective view of a portion of a QWIP focal plane array according to an embodiment of the present invention. Multiple structures, labeled 301 through 306, are formed on GaAs substrate 300 using conventional semiconductor process technology. Each structure comprises a reflective (and conductive) grating indicated by cross-hatching, QWIP layers, and doped layers to provide electrical contact to various groups of the QWIP layers. Referring to structure 301 as an example, structure 301 comprises a reflective grating indicated by cross-hatching, doped layer 301A, a group of QWIP layers 301B, doped layer 301C, a group of QWIP layers 301D, doped layer 301E, a group of QWIP layers 301F, and doped layer 301G.

For reference, a right handed coordinate system is indicated in FIG. 3 illustrating the x-axis, y-axis, and z-axis directions. The z-axis indicates the epitaxial growth direction of the QWIP focal plane array. When the QWIP focal plane array is used in an imaging system, the IR radiation is incident on the bottom of GaAs substrate 300, more or less normal to the bottom surface, depending upon the lens system (not shown). The top (cross-hatched) reflective gratings and underlying QWIP layers are etched, indicated by lines 307, so as to comprise multiple electrical contacts and QWIP layers insulated from each other. Each resulting electrical contact and its underlying QWIP layers define a pixel.

Six structures are illustrated in FIG. 3, structures 301 through 306. The top reflective gratings in structures 301, 303, and 305 have grooves that run in the x-axis direction, whereas the reflective gratings in structures 302, 304, and 306 have grooves that run in the y-axis direction. These reflective gratings allow the QWIP focal plane array for the embodiment of FIG. 3 to be polarization sensitive. This will be discussed in more detail later. Each structure has three groups of QWIP layers, each group sensitive to different frequency bands. For example, in structure 301, the group of QWIP layers 301B is sensitive to a first frequency band, the group of QWIP layers 301D is sensitive to a second frequency band, and the group of QWIP layers 301F is sensitive to a third frequency band. For some embodiments, these three frequency bands may be such that they essentially have little overlap in the frequency domain, so that each group of QWIP layers is sensitive to a different range of IR frequencies.

For some embodiments, each structure 302 through 306 has a group of QWIP layers sensitive to the same range of frequencies as the group of QWIP layers 301B, a group of QWIP layers sensitive to the same range of frequencies as the group of QWIP layers 301D, and a group of QWIP layers sensitive to the same range of frequencies as the group of QWIP layers 301F. However, by shorting out the various doped layers, and by controlling the depth of the top reflective grating, each structure has only one active group of QWIP layers, where in this sense active means contributing to a photodetector current when photons are absorbed.

For example, in structure 301, the top reflective grating is formed into doped layer 301A, and doped layer 301C may be shorted to doped layer 302G. In this way, the pixel contacts in structure 301 are connected to pixels sensitive to the first frequency band. Similarly, for structure 302, each contact is sensitive to the first frequency band because doped layer 302C in structure 302, which corresponds to doped layer 301C, is short circuited, e.g., connected to 302G.

In structure 303, the top reflective grating is formed to extend into doped layer 303C, and doped layer 303E may be short circuited so that only the group of QWIP layers sensitive to the second frequency band contributes a photodetector current. Similarly, only the group of QWIP layers sensitive to the second frequency band contributes a photodetector current in structure 304.

In structure 305, the top reflective grating is formed into doped layer 305E, which corresponds to doped layers 303E and 301E, so that the contacts in structure 305 provide pixel photodetector currents indicative of IR in the third frequency band. Similarly, structure 306 also provides pixel photodetector currents indicative of IR in the third frequency band.

The reflective gratings in structures 301, 303, and 305 are such that these structures provide photodetector currents sensitive to IR having an electric field with a non-zero component in the y-axis direction; and the reflective gratings in structures 302, 304, and 306 are such that these structures provide photodetector currents sensitive to IR having an electric field with a non-zero component in the x-axis direction. In this way, the QWIP focal plane array of FIG. 3 is made sensitive to IR radiation incident in the z-axis direction. That is, the reflective gratings allow for the QWIP focal plane array of FIG. 3 is be sensitive to a plane wave IR having a Poynting vector normal to the plane of substrate 300. This may be explained with reference to FIG. 4.

Figure 4:
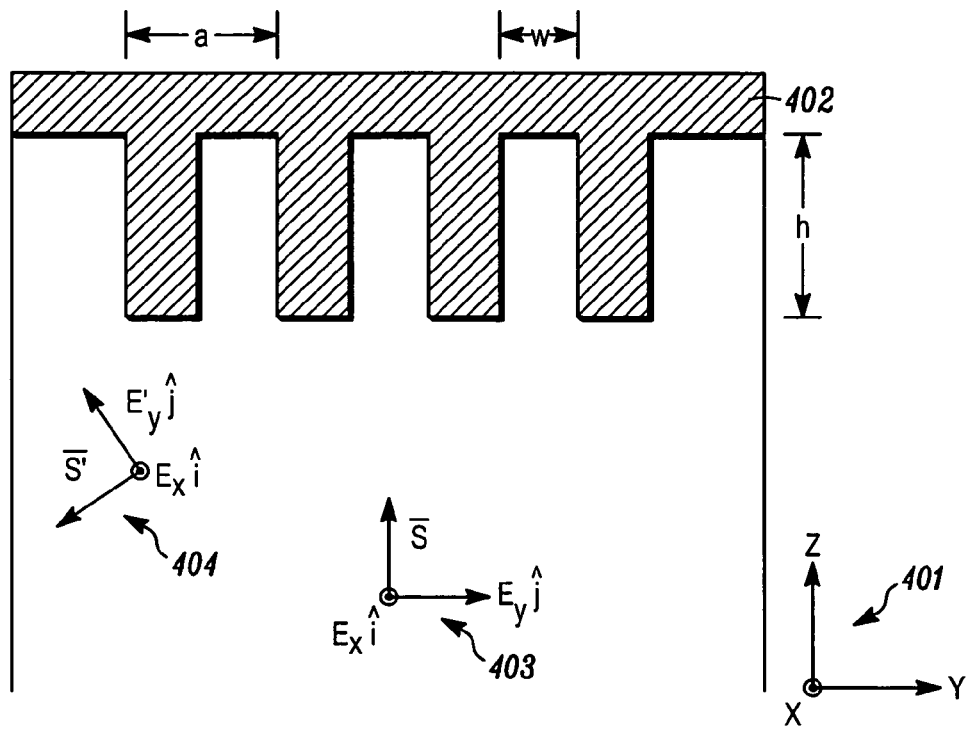
FIG. 4 illustrates reflection of infrared radiation from a reflective grating according to an embodiment of the present invention.

FIG. 4 is a pictorial illustration of IR radiation being reflected from a reflective grating. For simplicity, much of the structural elements are not shown. FIG. 4 presents a simplified plan view of the reflective grating, where for reference the coordinate system indicated in FIG. 3 is now shown as the coordinate system 401 in FIG. 4. The circle about the origin of the coordinate system 401 labeled x indicates an x-axis coming out of the illustration.

The reflective grating, labeled as 402 in FIG. 4, may be termed a linear grating. The grooves of reflective grating 402 run along the x-axis direction. Incident IR radiation is pictorially indicated by the label 403. Its Poynting vector $\vec{s}$ is directed in the z-axis direction, and the electric field vector lies in the x-y plane. Reflective IR radiation is pictorially indicated by the label 404. An effect of reflecting off reflective grating 402 is that the electric field vector now has a non-zero component in the z-axis direction. In a sense, the electric field vector in the y-axis direction, denoted as $E_y\hat{j}$ in FIG. 4, is rotated upon reflection, as indicated by $E'_y\hat{j}$ in FIG. 4. (Of course, there is a time-varying component to these vectors, which need not be indicated in the drawings in order to describe the embodiments.) With a non-zero electric field component in the z-axis direction, absorption of the reflected photons by the quantum wells is possible. There may be further reflections off the surface face of GaAs substrate 300, resulting in multiple reflections, thereby increasing the probability of absorption by a quantum well.

Note that the x-component of the electric field vector of the incident IR is not changed upon reflection, so that the QWIP illustrated in FIG. 4 is sensitive to an incident IR plane wave with an electric field polarized in the y-axis direction. A QWIP having a linear grating reflective layer with grooves oriented along the y-axis direction results in a QWIP sensitive to an incident IR polarized in the x-axis direction.

Various parameters of reflective grating 402 are indicated in FIG. 4, where h denotes the height (or depth) of the grooves in the z-axis direction, a denotes the period of the linear gratings, and w denotes the width of the grooves. Choosing the parameters a and w are well known, and may be chosen to provide efficient diffraction by the reflective grating. As one example, if θ is an angle relative to normal, then constructive interference in that direction may be obtained by choosing a such that a $\sin(\theta) = n\lambda/n_R$, where λ is the free-space wavelength in the center of the frequency band of interest, n is a non-negative integer, and $n_R$ is the index of refraction of the QWIP material. The ratio of w to a, which is a sort of duty cycle, may take on various values, such as around ½ as an example. However, embodiments are not limited to these expressions for a and w. As discussed with respect to the embodiment of FIG. 3, the height h is chosen so that electrical contact provided by reflective grating 402 is made to those QWIP layers having the frequency band of interest. However, the height h, for some embodiments, may be chosen to emphasize off-normal scattering in the frequency band of interest by minimizing normal reflection in the frequency band of interest. To minimize normal reflection, destructive interference in the normal direction (z-axis direction) may be provided by choosing h to be an odd integral number of quarter wavelengths, where the wavelength may be taken from the center of the frequency band of interest taking into effect the index of refraction of the QWIP material. That is, $$h = (2n+1)\frac{\lambda}{4n_R}.$$

Figure 5:
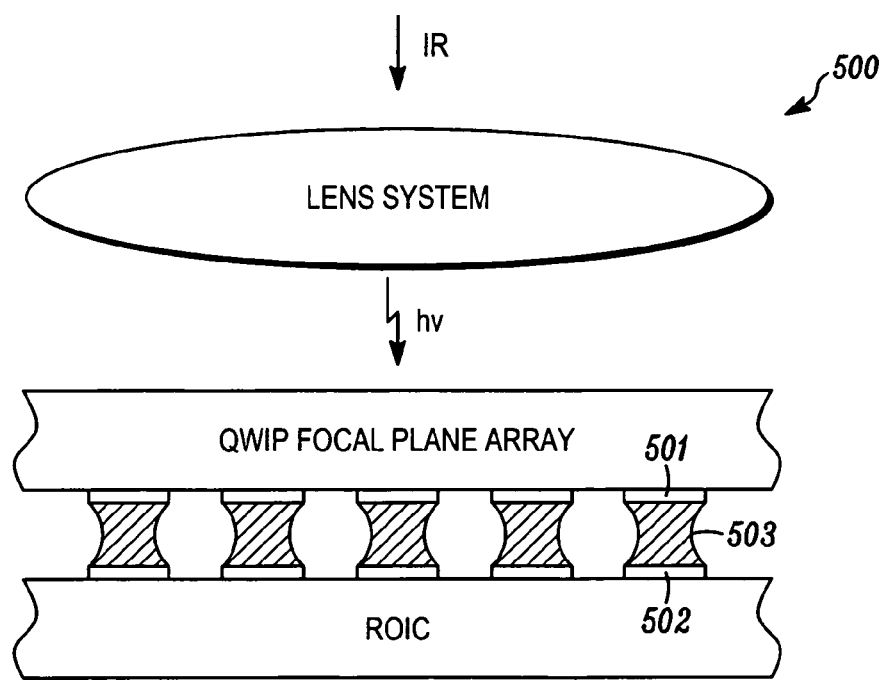
FIG. 5 illustrates an imaging system according to an embodiment of the present invention.

By utilizing groups of QWIP layers with sensitivities to different frequency bands, and by utilizing reflective gratings with grooves of appropriate depths and orientations, embodiment QWIP focal plane arrays may be constructed to provide multiple pixels conveying frequency and polarization information. The QWIP focal plane array may be integrated into a larger system. For example, the contacts in FIG. 3 may be soldered to solder bumps, e.g. Indium bumps, to make electrical contact with a read-out integrated circuit (ROIC). FIG. 5 illustrates this in simplified fashion, illustrating camera system 500 comprising a lens system for imaging IR onto a QWIP focal plane array. The QWIP focal plane array has contacts 501 (formed from the reflective gratings) soldered to soldering pads 502 on an ROIC by way of solder 503.

Standard process technology may be used to manufacture embodiments of the present invention. For example, the reflective gratings may be created by photolithography and dry etching through a cap layer on top of the QWIP structures and covering it with a reflective metal layer, such as gold. The structures in FIG. 3 used to provide the three frequency bands may be defined by a deep trench etch process, where the unwanted spectral bands are eliminated by a detector short-circuiting process. The individual pixels for the QWIP focal plane array may be defined by standard photolithographic processing techniques, e.g., dry etching, chemical etching, metal deposition, etc. The quantum wells may be comprised of various materials. As one example, alternating layers of GaAs and $Al_{0.3}Ga_{0.7}As$ may be used. However, embodiments are not limited to III-V compounds, and other materials may be used.

Various numbers of pixels may be realized. For example, embodiments may be fabricated with 1024 by 1024 pixels on a QWIP focal plane array to provide signal information comprising three frequency bands of interest and two orthogonal polarizations. As an example, the frequency bands of interest may be in the ranges of 8 to 9.2 microns, 9.2 to 10.6 microns, and 10.6 to 12 microns. However, this is merely an example. Other embodiments may have other array pixel sizes and frequency bands, and some embodiments may have only one frequency band sensitivity.

Some embodiments may employ reflective gratings having other groove directions than those illustrated in FIG. 3, or having other groove directions in addition to those illustrated in FIG. 3. Furthermore, some embodiments may have reflective gratings with two sets of grooves intersecting each other, so that there is a set of grooves running in a first direction and a set of grooves running in a second direction orthogonal to the first direction. The resulting reflective grating would then allow the underlying QWIP layers to absorb IR radiation having any polarization in the x-y plane, so that the resulting pixels do not provide polarization discrimination.

Various modifications may be made to the disclosed embodiments without departing from the scope of the invention as claimed below. For example, the number of frequency bands for some embodiments may be other than three. As another example, the polarization sensitivities may be in directions other than that indicated in FIG. 3. For example, the grooves of the reflective gratings may be along other axes than those parallel and perpendicular to the structures (the x and y axes in FIG. 3.) Some embodiments may have more than two polarization sensitivity directions.

Various mathematical relationships may be used to describe relationships among one or more quantities. For example, a mathematical relationship or mathematical transformation may express a relationship by which a quantity is derived from one or more other quantities by way of various mathematical operations, such as addition, subtraction, multiplication, division, etc. Or, a mathematical relationship may indicate that a quantity is larger, smaller, or equal to another quantity. These relationships and transformations are in practice not satisfied exactly, and should therefore be interpreted as "designed for" relationships and transformations. One of ordinary skill in the art may design various working embodiments to satisfy various mathematical relationships or transformations, but these relationships or transformations can only be met within the tolerances of the technology available to the practitioner.

Accordingly, in the following claims, it is to be understood that claimed mathematical relationships or transformations can in practice only be met within the tolerances or precision of the technology available to the practitioner, and that the scope of the claimed subject matter includes those embodiments that substantially satisfy the mathematical relationships or transformations so claimed.

What is claimed is:

1. An apparatus comprising:
   a first structure comprising a plurality of quantum wells and a reflective grating having grooves running in a first direction; and
   a second structure comprising a plurality of quantum wells and a reflective grating having grooves running in a second direction, wherein the second direction is different than the first direction.

2. The apparatus as set forth in claim 1, wherein the first direction is orthogonal to the second direction.

3. The apparatus as set forth in claim 1, the plurality of quantum wells in the first structure comprising:
   a first group of stacked layers of quantum wells to absorb infrared radiation in a first frequency band; and
   a second group of stacked layers of quantum wells to absorb infrared radiation in a second frequency band.

4. The apparatus as set forth in claim 3, the first and second groups of stacked layers of quantum wells each having, respectively, a top layer and a bottom layer; the first structure comprising:
   a first doped layer in electrical contact with the top layer of the first group of stacked layers of quantum wells;
   a second doped layer in electrical contact with the bottom layer of the first group of stacked layers of quantum wells and the top layer of the second group of stacked layers of quantum wells; and
   a third doped layer in electrical contact with the bottom layer of the second group of stacked layers of quantum wells.

5. The apparatus as set forth in claim 4, wherein the reflective grating of the first structure is in electrical contact with the first doped layer, and the second and third doped layers are short circuited to each other.

6. The apparatus as set forth in claim 4, wherein the reflective grating of the first structure is formed to be in electrical contact with the second doped layer and to short circuit the first doped layer to the second doped layer.

7. The apparatus as set forth in claim 4, further comprising a third structure comprising a reflective grating having grooves running in the first direction.

8. The apparatus as set forth in claim 7, the third structure comprising:
   a first group of stacked layers of quantum wells to absorb infrared radiation in the first frequency band; and
   a second group of stacked layers of quantum wells to absorb infrared radiation in the second frequency band.

9. The apparatus as set forth in claim 8, the first and second groups of stacked layers of quantum wells in the third structure each having, respectively, a top layer and a bottom layer; the third structure comprising:
   a first doped layer in electrical contact with the top layer of the first group of stacked layers of quantum wells in the third structure;
   a second doped layer in electrical contact with the bottom layer of the first group of stacked layers of quantum wells in the third structure and the top layer of the second group of stacked layers of quantum wells in the third structure; and
   a third doped layer in electrical contact with the bottom layer of second group of stacked layers of quantum wells in the third structure.

10. The apparatus as set forth in claim 9, wherein the reflective grating of the first structure is in electrical contact with the first doped layer of the first structure, and the second and third doped layers in the first structure are short circuited to each other.

11. The apparatus as set forth in claim 10, wherein the reflective grating of the third structure is formed to be in electrical contact with the second doped layer of the third structure and to short circuit the first doped layer of the third structure to the second doped layer of the third structure.

12. The apparatus as set forth in claim 11, the first structure having an index of refraction $n_R$, the reflective grating in the first structure having a groove depth h, where $$h = (2n+1)\frac{\lambda}{4n_R},$$

where n is a non-negative integer, and where $\lambda$ is a wavelength in the first frequency band.

13. The apparatus as set forth in claim 12, the third structure having the index of refraction $n_R$, the reflective grating in the third structure having a groove depth $h_2$, where $$h_2 = (2n_2+1)\frac{\lambda_2}{4n_R},$$

where $n_2$ is a non-negative integer, and where $\lambda_2$ is a wavelength in the second frequency band.

14. The apparatus as set forth in claim 1, the plurality of quantum wells in the first structure comprising a group of quantum wells sensitive to infrared radiation having a free-space wavelength $\lambda$, the first structure having an index of refraction $n_R$, the reflective grating in the first structure having a groove depth h, where $$h = (2n+1)\frac{\lambda}{4n_R},$$

where n is a non-negative integer.

15. The apparatus as set forth in claim 4, the plurality of quantum wells in the first structure comprising a group of quantum wells sensitive to infrared radiation having a free-space wavelength $\lambda$, the first structure having an index of refraction $n_R$, the reflective grating in the first structure having a groove depth h, where $$h = (2n+1)\frac{\lambda}{4n_R},$$

where n is a non-negative integer.

16. The apparatus as set forth in claim 1, further comprising:
   a substrate onto which the first and second structures are formed; and
   a lens system to focus infrared radiation onto the substrate.

17. The apparatus as set forth in claim 1, wherein the reflective grating in the first structure is etched to provide electrically independent contacts.

18. The apparatus as set forth in claim 17, further comprising a processor comprising solder pads, wherein the electrically independent contacts are soldered to the soldering pads.

19. The apparatus as set forth in claim 1, further comprising:
   a third structure comprising a plurality of quantum wells and a reflective grating having first and second sets of grooves, where the first set of grooves orthogonally intersects the second set of grooves.

* * * * *